United States Patent [19]
Hori

[11] Patent Number: 5,132,636
[45] Date of Patent: Jul. 21, 1992

[54] TRIANGULAR TO SINE WAVE CONVERTER

[75] Inventor: Toshio Hori, Tokyo, Japan

[73] Assignee: Internix Kabushiki Kaisha, Tokyo, Japan

[21] Appl. No.: 511,737

[22] Filed: Apr. 20, 1990

[51] Int. Cl.⁵ .......................... B23K 1/00; H03K 5/00
[52] U.S. Cl. ...................................... 328/22; 328/13; 307/261; 307/268
[58] Field of Search ...................... 328/21, 22, 13, 14, 328/178, 160, 158; 307/261, 268, 228

[56] References Cited

U.S. PATENT DOCUMENTS 3,350,575  10/1967  Crouse .................................. 328/22
3,821,652   6/1974  Wiebe et al. ......................... 307/261
4,599,703   7/1986  Bilharz ................................ 364/851

*Primary Examiner*—Stanley D. Miller
*Assistant Examiner*—Toan Tran

[57] ABSTRACT

A triangular to sine wave converters has a first multiplier having inputs connected in the form of a square multiplier and receiving a triangular-wave input; a direct current bias shifting a parabolic wave output of the first multiplier to a negative polarity; and a second multiplier having an input Y receiving a shifting output of the direct current bias, the second multiplier having an output X receiving the triangular-wave input, whereby the second multiplier produces a cubic-wave output approximate to a sine wave.

22 Claims, 8 Drawing Sheets

TRIANGULAR TO SINE WAVE CONVERTER

BACKGROUND OF THE INVENTION

1. Field of the Invention

The present invention relates to a triangular to sine wave converter receiving a triangular wave to produce an output of a substantially sinusoidal waveform.

2. Description of the Related Art

As well known, a sinusoidal signal of an electronic apparatus is produced by a combination of an oscillator producing a reference frequency signal and a circuit waveform-shaping the received reference frequency to produce a sine wave.

A waveform-shaping circuit of a sine-wave generator generally employs a diode function generator. However, the diode function generator has a decisive drawback in producing a differential noise. FIG. 6 illustrates a prior-art sine-wave generator free from differential noise. The sine-wave generator of FIG. 6 comprises two four-input multipliers $M_1$ and $M_2$ receiving a reference frequency signal $V_i$ and produces a sinusoidal output $V_o$ by means of the following circuit transfer function:

$$V_o = \frac{1.5715\ V_i - 0.004317\ V_i^3}{1 + 0.001398\ V_i^2}$$

Factorizing the transfer function produces the following expression:

$$V_o = \frac{-3.088\ V_i^3 + 1124.1\ V_i}{V_i^2 + 715.31}$$
$$= \frac{-3.088\ V_i(V_i^2 - 364.0)}{V_i^2 + 715.31}$$
$$= \frac{-3.008\ V_i(V_i + 19.1)(V_i - 19.1)}{(V_i + j26.75)(V_i - j26.75)}$$
$$= \frac{-3.088\ V_i(V_i + 19.0794639)(V_i - 19.0794639)}{(V_i + j26.7452348)(V_i - j26.7452348)}$$

The denominators of the final expression comprise the imaginary number.

Since the prior-art sine-wave generator of FIG. 6 employs special operators and has a relatively complicated configuration of circuit, it is costly. In view of function, the transfer function of the sine-wave generator, which includes a numerator in the form of a cubic expression and a denominator in the form of a quadratic expression, is very disadvantageous in signal processing.

SUMMARY OF THE INVENTION

An object of the present invention is to provide a triangular to sine wave converter with a relatively simple configuration, the triangular to sine wave converter being inexpensive and convenient in use.

In order to achieve the object of the present invention, a first aspect of the present invention comprises: a first multiplier having inputs connected in the form of square multiplier and receiving a triangular-wave input; a direct current (DC) bias shifting a parabolic wave output (appearing only in a plus side) of said first multiplier to a minus side; and a second multiplier having an input Y receiving a shifting parabolic wave output of said DC bias, said second multiplier having an output X receiving the triangular-wave input, whereby said second multiplier produces a cubic-wave output approximate to a sine wave.

The triangular to sine wave converter of the first aspect of the present invention may further comprise an adder adding the cubic-wave output of said second multiplier and the triangular-wave input. Alternatively, the triangular to sine wave converter of the first aspect of the present invention may further comprise a third multiplier of the same type as the first multiplier and provided between the triangular-wave input and the input X of said second multiplier.

When the triangular to sine wave converter receives the triangular-wave input as a reference frequency signal, it produces a cubic-wave output in the form of sine wave from the triangular-wave input, the cubic-wave output being expressed by the following approximation of the transfer function of the triangular to sine wave converter:

$$V_o \approx -(X^3 - 3X),$$

wherein $V_o$ represents the sine-wave output and X represents the triangular-wave input.

The adder which may be included in the triangular to sine wave converter adds or subtracts between the triangular-wave input and cubic-wave output under an adjustment of a shift voltage so that the transfer function of the triangular to sine wave converter is as follows:

$$V_o = -(X^3 - 3X).$$

The third multiplier operates as a simple high-frequency signal propagation delay compensation element instead of an arithmetic operator. The third multiplier which is of the same type as the first multiplier causes the X and Y inputs of the second multiplier to have the same delay with reference to the triangular-wave input.

A second aspect of the present invention comprises: a first multiplier having inputs connected in the form of a square multiplier and receiving a triangular-wave input; a second multiplier having an input Y receiving a parabolic wave output of said first multiplier, said second multiplier having an input X receiving the triangular-wave input; an adder adding a cubic-wave output of said second multiplier and the triangular-wave input; and an amplifier with a triple amplification factor provided intermediate a triangular-wave input line of said adder.

The amplifier of the triangular to sine wave converter of the second aspect of the present invention comprises a third multiplier having an input Y receiving a triple voltage signal of the triangular-wave input, the triangular-wave input line of said adder comprising said amplifier and a fourth multiplier of the same type as the second multiplier and connected in series to said amplifier, and an X input line of said second multiplier comprises a fifth multiplier of the same type as said first multiplier and receiving the triangular-wave input.

The triangular to sine wave converter of the second aspect of the present invention has the following transfer function:

$$V_o \approx -(X^3 - 3X).$$

The combination of the first and second multipliers produces a cubic-wave output of the triangular-wave input and the amplifier produces a triple voltage signal of the triangular-wave input. The adder processes the cubic-wave output $X^3$ and the triple voltage $3X$ by the operation $(-(X^3-3X))$ under a fine adjustment of a triple gain of the amplifier to produce a very approximate corresponding sine-wave output $V_o$.

The third multiplier of the triangular to sine wave converter of the second aspect of the present invention operates as an amplifier having an input X receiving the triangular-wave input to produce an output with the triple amplitude of the triangular-wave input. The fourth and fifth multipliers operate as a simple high-frequency signal propagation delay compensation element instead of an arithmetic operator. The fourth and fifth multipliers which are of the same types as the third and first multipliers cause the plus and minus inputs of the adder to have the same delay with reference to the triangular-wave input.

A triangular to sine wave converter of a third aspect of the present invention comprises: a square multiplier receiving a triangular-wave input; a direct current (DC) bias shifting a parabolic wave output of said square multiplier to a minus side by an amount of about 3 times the maximum of the triangular-wave input voltage; a multiplier having an input Y receiving a shifting output of said DC bias, said multiplier having an input X receiving the triangular-wave input, whereby said multiplier produces a cubic-wave output approximate to a sine-wave.

The triangular to sine wave converter of a third aspect of the present invention has the following transfer function $$V_o \approx -(X^3-3X).$$

The triangular-wave input X (maximum 1) is applied to the square multiplier and multiplier. The square multiplier produces an output $X^2$ which is applied to the DC bias. The DC bias shifts the signal $X^2$ to a minus side by the amount of a triple maximum of the triangular-wave input X to produce an output $(X^2-3)$ which is applied to the multiplier. The multiplier multiplies the signal $(X^2-3)$ by the input triangular-wave X to produce an output $X(X^2-3)=X^3-3X$. An inverted output $(X^3-3X)$ provides the sine wave $V_o$.

A triangular to sine wave converter of a fourth aspect of the present invention comprises: a square multiplier receiving a triangular-wave input; a multiplier having an input Y receiving a square output of said square multiplier, said multiplier having an input X concurrently receiving the triangular-wave input; an adder having a minus input receiving an output of said multiplier, said adder having a plus input; and an amplifier tripling the amplitude of the triangular-wave input and producing an output which is applied to the plus input of said adder, whereby said adder produces a cubic-wave output approximate to a sine wave.

In accordance with the triangular to sine wave converter of the fourth aspect of the present invention, the square multiplier squares the triangular wave input X to produce an output $X^2$ and then the multiplier multiplies the signal $X^2$ by the triangular wave input X to produce an output $X^3$ which is applied to the minus input of the adder. The adder receives and about triple amplitude triangular wave input $3X$ at the plus input of the adder to produce an output $(3X-X^3)$ which is inverted to the sine wave $V_o$.

The multiplier of the triangular to sine wave converter of the third and fourth aspects of the present invention squares the total $(X+Y)$ of the X and Y inputs of the multiplier and the difference $(X-Y)$ between the X and Y inputs of the multiplier and produces a difference between the total $(X+Y)$ and the difference $(X+Y)$, i.e., a product $(4XY)$ which is attenuated to be $\frac{1}{4}$ to produce an output $(XY)$.

The multiplier of the triangular to sine wave converter of the third and fourth aspects of the present invention comprises: an adder adding X and Y inputs of said multiplier; a subtracter producing a difference between the X and Y inputs of said multiplier; a first square multiplier squaring an output of the adder; a second square multiplier squaring an output of the first subtracter; a second subtracter producing a difference between outputs of first and second square multipliers; and attenuator attenuating an output of the second subtracter to be $\frac{1}{4}$ to produce a production of the X and Y inputs of said multiplier.

DESCRIPTION OF THE PREFERRED EMBODIMENTS

The preferred embodiments of the present invention will be described with reference to the drawings.

Figure 1:
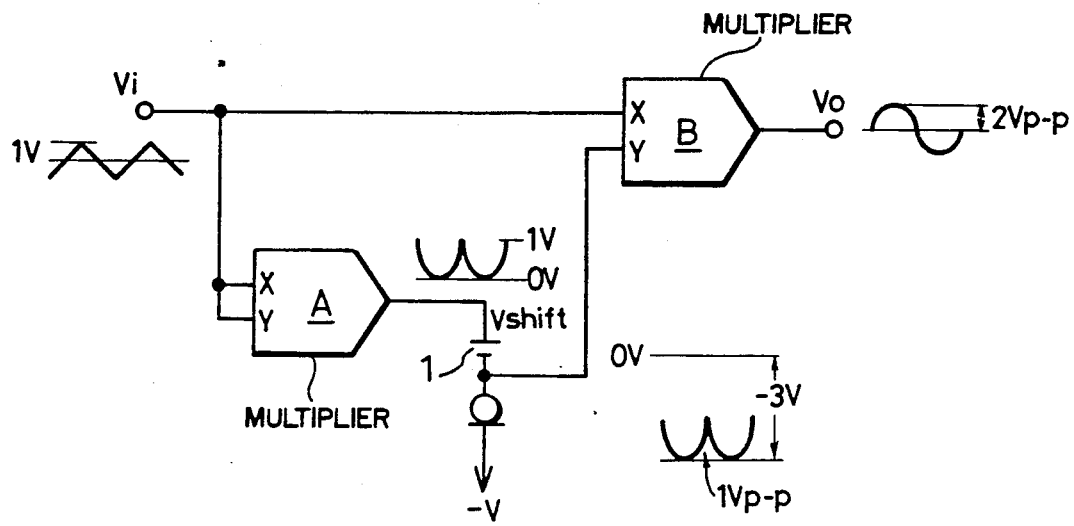
FIG. 1 is a circuit block diagram of a triangular to sine wave converter of a first embodiment of the present invention.

FIG. 1 is a circuit block diagram of a triangular to sine wave converter of a first embodiment of the present invention. A triangular-wave input $V_i$ is applied to connected inputs X and Y of a first multiplier A made up, e.g., with a four-quadrant multiplier and concurrently to an input X of a second multiplier B made up, e.g., with a four-quadrant multiplier. An output of the first multiplier A is connected to a direct current or DC bias (V-shift) 1 series connected to a constant-current regulated power. The resulting shifting output is applied to an input Y of the second multiplier B. The second multiplier B produces an output $V_o$.

When a reference triangular wave with 1V-peak amplitude is applied to the connected inputs X and Y of the first multiplier A, the multiplier A serves as a square multiplier because of the connected inputs X and Y thereof to produce a parabolic wave with 1V-peak amplitude (a parabolic wave, see a waveform illustrated on the output side of the first multiplier A). The DC bias 1 shifts the parabolic wave with 1V-peak amplitude (appearing only on a plus side) so that the zero voltage of the parabolic wave with 1V-peak amplitude is $-3V$ and applies an output to the input Y of the second multiplier B. Since the input X of the second multiplier B concurrently receives the triangular wave with 1V-peak amplitude, the second multiplier B produces an output $V_o$ in a cubic waveform. This cubic waveform of the output $V_o$ of the second multiplier B is very approximate to a sine-wave. An accurate adjustment of the V-shift of the DC bias 1 provides a 0.001% or lower distortion rate of the cubic waveform with reference to a sine-wave at a 3.0464808 V shift.

A transfer function of the FIG. 1 triangular to sine wave converter is as follows:

$$V_o = -(V_i^3 - V\text{-shift} \times V_i) \quad (1).$$

The equation (1) is converted to the following equation (2):

$$V_o = -V_i(V_i^2 - V\text{-shift}) \quad (2).$$

Setting $V_i = X$, the V-shift at point of the minimum distortion rate is as follows:

$$2 \int_0^{\pi/2} \sin X \, dX - \int_0^1 X^3 - V\text{-shift} \, X \, dX \quad (3)$$

In accordance with the equation (3), the V-shift at point of the minimum distortion rate is 3.0464808 V in order to as much approximate the output $V_o$ of the second multiplier B to a sine wave as possible.

Figure 5:
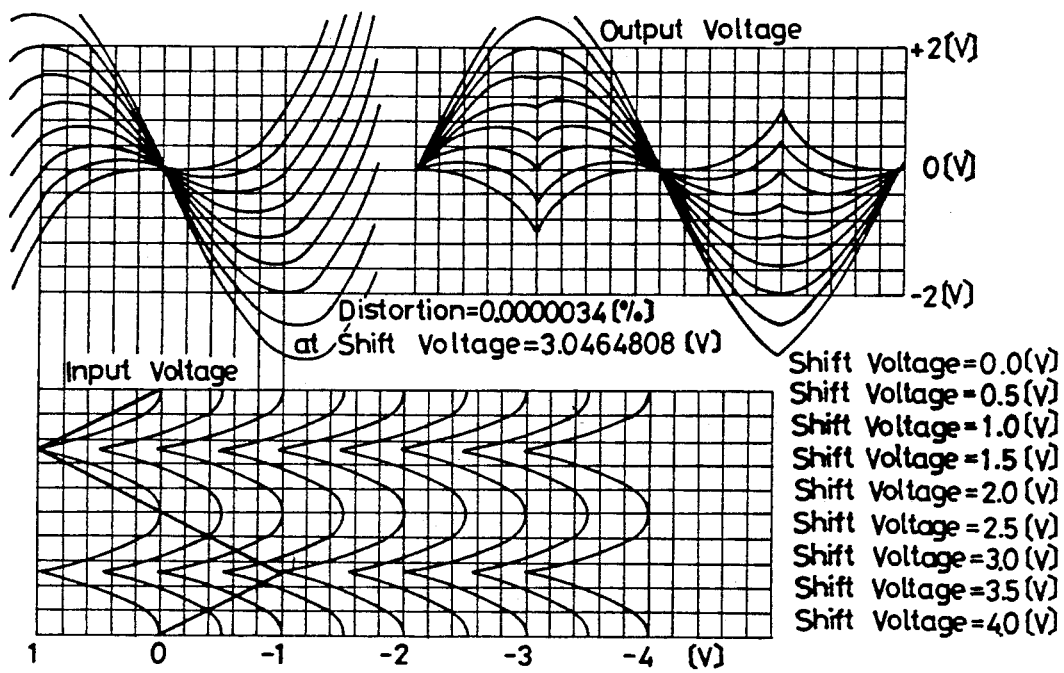
FIG. 5 is a graph illustrating a simulation characteristic of the operation of the triangular to sine wave converter of the first embodiment of the present invention.
Figure 6:
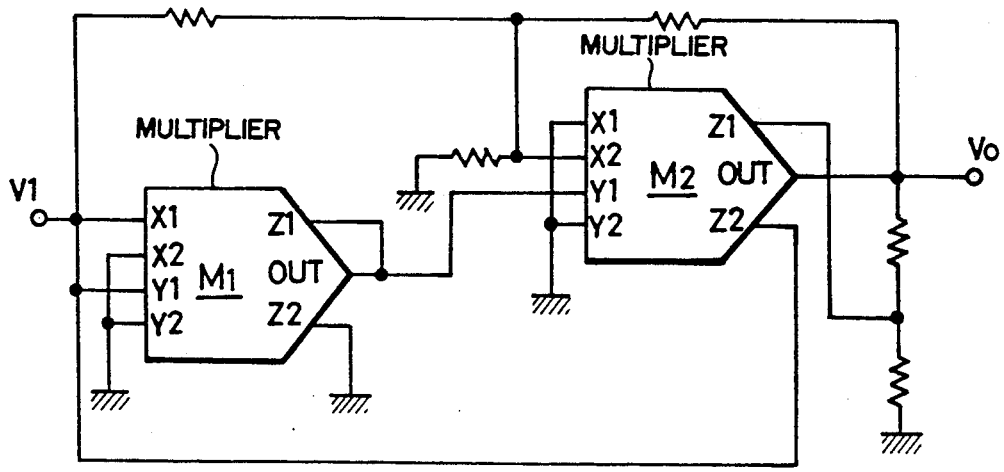
FIG. 6 is a circuit diagram of a prior-art sine-wave generator.

FIG. 5 is a graph illustrating a simulation characteristic of the operation of the triangular to sine wave converter of the first embodiment of the present invention. Solid lines of FIG. 5 represent the most preferable operation of the triangular to sine wave converter of the first embodiment.

The transfer function of the triangular to sine wave converter of the first embodiment may be as follows for a simplified computation of the output $V_o$ of the triangular to sine wave converter of the first embodiment though the distortion rate of the output $V_o$ with reference to the corresponding sine-wave is somewhat large:

$$V_o \approx -(X^3 - 3X) \quad (4).$$

Figure 2:
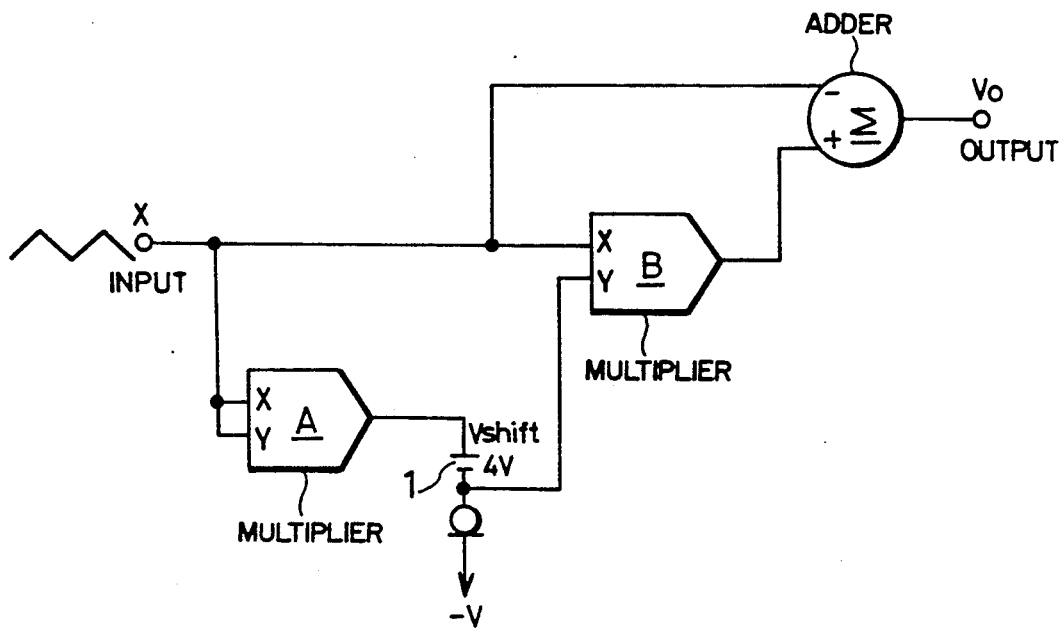
FIG. 2 is a circuit block diagram of a triangular to sine wave converter of a second embodiment of the present invention.

FIG. 2 is a circuit block diagram of a triangular to sine wave converter of a second embodiment of the present invention. The triangular to sine wave converter of the second embodiment further comprises an adder added to the circuit configuration of the triangular to sine wave converter of the first embodiment. The adder has two inputs, a minus input being connected to the triangular-wave input X and a plus input being connected to the output $V_o$ of the second multiplier B. The transfer function of the triangular to sine wave converter of the second embodiment is as follows:

$$V_o = -(X^3 - 4X) - X \quad (5)$$
$$= -(X^3 - 3X)$$

Thus, the V-shift of the DC bias of the triangular to sine wave converter of the second embodiment is 4 times the input X.

Figure 3:
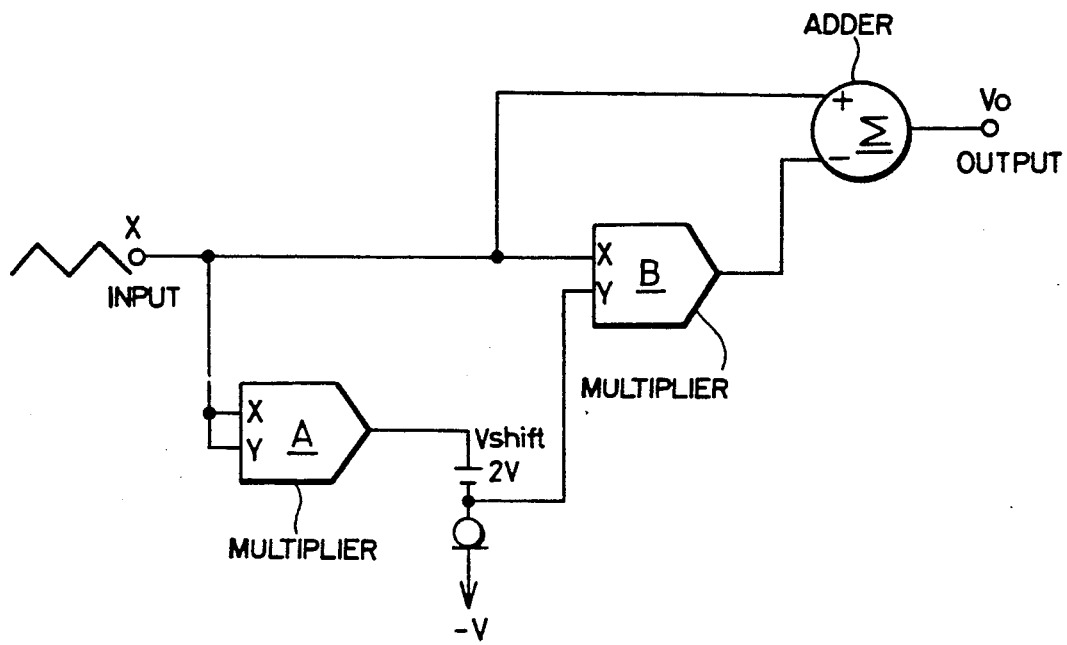
FIG. 3 is a circuit block diagram of a triangular to sine wave converter of a third embodiment of the present invention.

FIG. 3 is a circuit block diagram of a triangular to sine wave converter of the third embodiment of the present invention. The triangular to sine wave converter of the third embodiment further comprises an adder added to the circuit configuration of the triangular to sine wave converter of the first embodiment. The adder of the third embodiment has two inputs, one plus input being connected to the triangular-wave input X and the other plus input being connected to the output $V_o$ of the second multiplier B. The transfer function of the triangular to sine wave converter of the third embodiment is as follows:

$$V_o = -(X^3 - 2X) + X \quad (6)$$
$$= -(X^3 - 3X)$$

Thus, the V-shift of the DC bias of the triangular to sine wave converter of the third embodiment is twice the triangular-wave input X.

Figure 4:
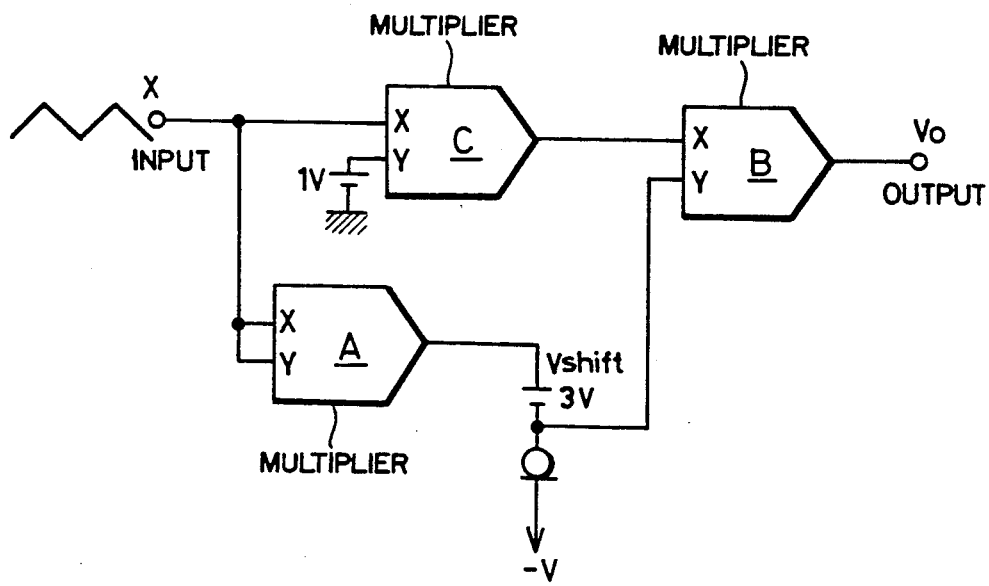
FIG. 4 is a circuit block diagram of a triangular to sine wave converter of a fourth embodiment of the present invention.

FIG. 4 is a circuit block diagram of a triangular to sine wave converter of the fourth embodiment of the present invention. The triangular to sine wave converter of the fourth embodiment further comprises a multiplier C added to the circuit configuration of the triangular to sine wave converter of the first embodiment. The multiplier C equals the first multiplier A and inserted between the triangular-wave input X and input X of the second multiplier B. The FIG. 4 triangular to sine wave converter improves a high frequency characteristic thereof.

As shown in FIG. 1, when the triangular to sine wave converter produces a high-frequency sine-wave of cubic-wave output, the triangular-wave input $V_i$ is applied directly to the input X of the second multiplier B and the output of the first multiplier A V-shifted by the DC bias 1 is applied to the input Y of the second multiplier B. The signal applied to the input Y of the second multiplier B going through many circuit elements (e.g., transistors) lags the signal applied to the input X of the second multiplier B. Thus, a time difference between two signals applied to the inputs X and Y of the second multiplier B must be compensated.

Since a general purpose analog four-quadrant multiplier is often made up of a GILBERT cell, the compensation of the time difference is difficult so that the qualities and temperature characteristics of the circuit elements are taken into account.

However, since the triangular to sine wave converter of the fourth embodiment employs the multiplier C equalling the multiplier A and provided intermediate a line from the triangular-wave input X to the input X of the second multiplier B, it processes a signal to be applied to the input X of the second multiplier B so that the multipliers A and C operate under the same conditions, e.g., temperature characteristics of the multipliers A and C.

Figure 7:
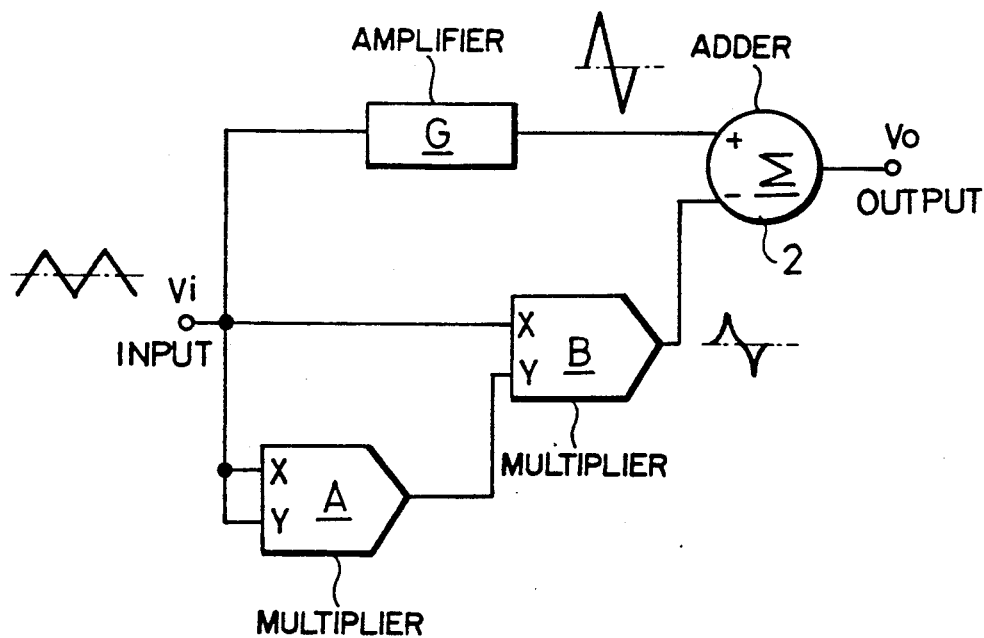
FIG. 7 is a circuit block diagram of a triangular to sine wave converter of a fifth embodiment of the present invention.

FIG. 7 is a circuit block diagram of a triangular to sine wave converter of a fifth embodiment of the present invention. A triangular-wave input $V_i$ is applied to connected inputs X and Y of a first multiplier A and also to an input X of the second multiplier B. The output of the multiplier A is applied to the other input Y of the multiplier B. The output of the multiplier B is applied to the minus input of an adder 2. An amplifier G with an amplification factor of about 3 is provided between the triangular-wave input $V_i$ and a plus input of the adder 2. Thus, the plus input of the adder 2 is a triple voltage of the processed triangular-wave input $V_i$. The adder 2 produces an output $V_o$.

When a reference triangular wave with 1V-peak amplitude is applied to the connected inputs X and Y of the multiplier A, the multiplier A serves as a square multiplier because of the connected inputs X and Y thereof to produce a square wave with 1V-peak amplitude (a parabolic wave, see a waveform illustrated on the output side of the multiplier A). The adder 2 receives the cubic-wave output of the second multiplier B and the triple voltage of the triangular-wave input $V_i$ produced by the amplifier G to produce the sine-wave output $V_o$.

The transfer function of the triangular to sine wave converter of fifth embodiment is as follows:

$$V_o = -(X^3 - 3X) \qquad (7)$$

wherein $V_o$ represents the sine-wave output and X represents the triangular-wave input. The waveform of the output $V_o$ of the adder 2 is very approximate to a sine-wave. An accurate adjustment of the amplification factor of the amplifier G provides a 0.001% or lower distortion rate of the cubic waveform of the output $V_o$ of the adder 2 with reference to the true sine-wave at a 3.0464808 amplification rate.

Figure 9:
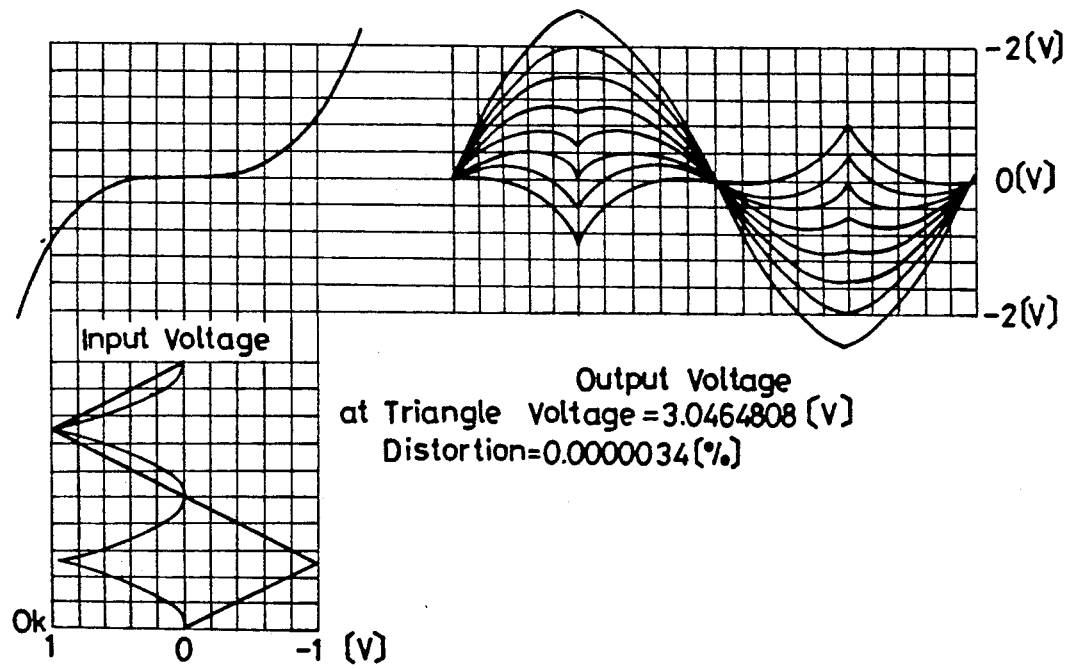
FIG. 9 is a graph illustrating a simulation characteristic of the operation of the triangular to sine wave converter of the fifth embodiment of the present invention.

FIG. 9 is a graph illustrating a simulation characteristic of the operation of the triangular to sine wave converter of the fifth embodiment of the present invention. Solid lines of FIG. 9 represent the most preferable operation of the triangular to sine wave converter of the fifth embodiment.

Figure 8:
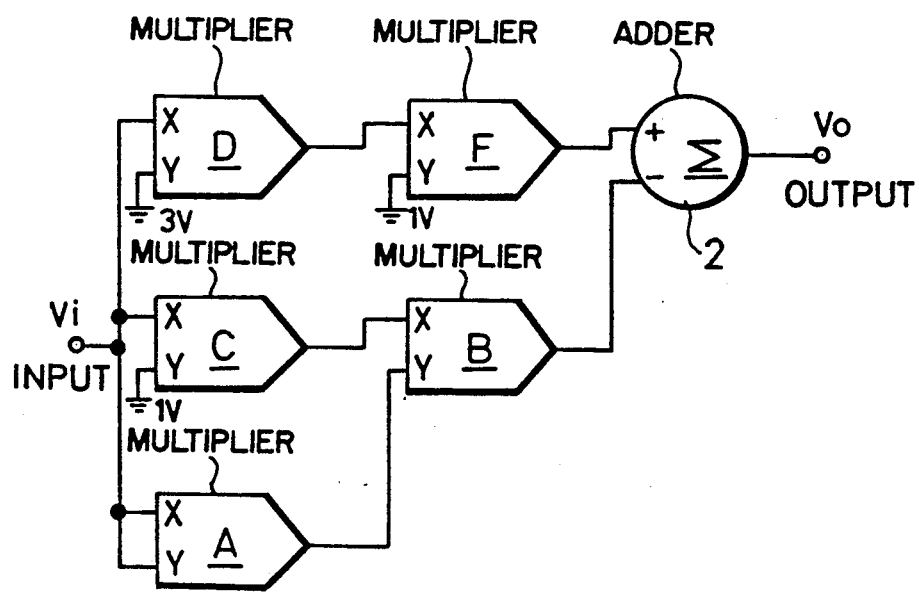
FIG. 8 is a circuit block diagram of a triangular to sine wave converter of a sixth embodiment of the present invention.

FIG. 8 is a circuit block diagram of a triangular to sine wave converter of a sixth embodiment of the present invention improving a high-frequency signal propagation delay compensation characteristic. The triangular to sine wave converter of the sixth embodiment comprises further to the triangular to sine wave converter of the fifth embodiment: multipliers D and F connected in series, instead of the amplifier G, the input X of the multiplier D receiving the input triangular-wave voltage $V_i$ and the input Y of the multiplier D receiving a constant voltage of three volts, the input X of the multiplier F receiving the input triangular-wave voltage $V_i$ and the input Y of the multiplier F receiving a constant voltage of 1 volt; and a multiplier C equalling the multiplier A and provided between the triangular-wave input $V_i$ and the input X of the multiplier B, the input Y of the multiplier C receiving a constant voltage of 1 volt. The multiplier C operates in the same manner as the multiplier F so as to compensate a first stage delay in an output of the multiplier A (i.e., parabolic function generator).

As shown in FIG. 7, when the triangular to sine wave converter of the fifth embodiment produces a high-frequency sine-wave of a cubic-wave output, the triangular-wave input $V_i$ is applied directly to the input X of the multiplier B and the output of the multiplier A is applied to the input of the multiplier B. The signal applied to the input Y of the multiplier B going through many circuit elements (e.g., transistors) lags the signal applied to the input X of the multiplier B. Thus, a time difference between two signals applied to the inputs X and Y of the multiplier B must be compensated.

Since a general purpose analog four-quadrant multiplier is often made up of a GILBERT cell, the compensation of the time difference is difficult so that the qualities and temperature characteristics of the circuit elements are taken into account.

However, since the triangular to sine wave converter of the sixth embodiment of FIG. 8 employs the multiplier C equalling the multiplier A and provided intermediate a line from the triangular-wave input $V_i$ to the input X of the multiplier B, it processes a signal to be applied to the input X of the multiplier B so that the multipliers A and C operate under the same conditions, e.g., temperature characteristics of the multipliers A and C.

In accordance with the triangular to sine wave converter of the sixth embodiment of FIG. 8, the adder 2 have the two-stage multipliers connected in series between the reference triangular-wave input $V_i$ and the plus and minus inputs of the adder 2 so that the two lines from the reference triangular-wave input $V_i$ and the inputs of the adder operate under the same condition. Thus, the triangular to sine wave converter of the sixth embodiment has a good high-frequency signal propagation characteristic.

Figure 10:
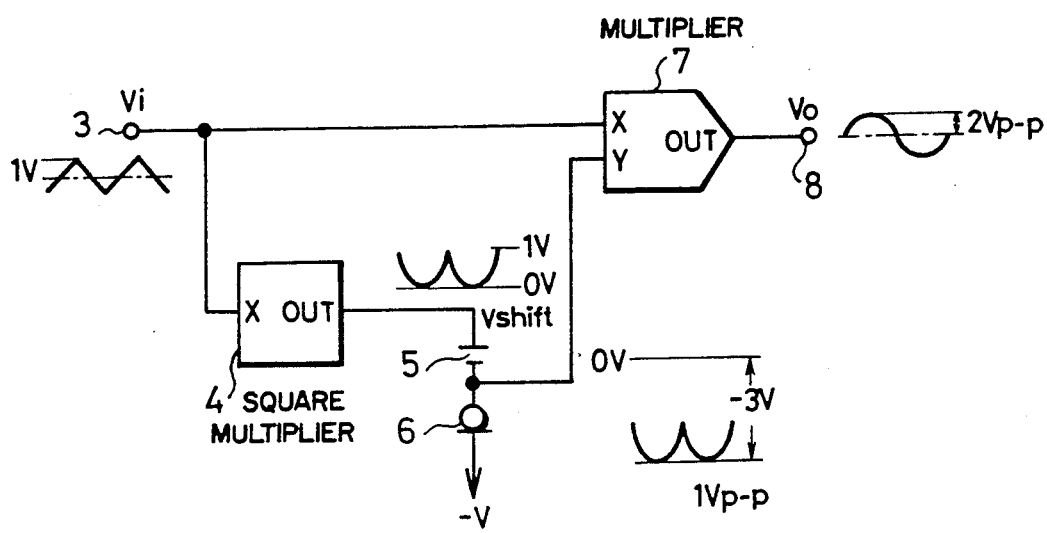
FIG. 10 is a circuit block diagram of a triangular to sine wave converter of a seventh embodiment of the present invention.

FIG. 10 is a circuit block diagram of a triangular to sine wave converter of a seventh embodiment of the present invention. A triangular-wave input (voltage) $V_i$ applied to an input terminal 3 is applied to an input X of a square multiplier 4 and also to an input X of a multiplier 7. The output of the square multiplier 4 is connected to the input of a DC bias (V-shift) 5 having the output connected in series to a constant-current power source 6. A shifting output of the DC bias is applied to an input Y of the multiplier 7. An output terminal 8 of the triangular to sine wave converter of the seventh embodiment produces an output (voltage) $V_o$.

When a reference triangular wave with 1V-peak amplitude is applied to the input X of the square multiplier 4, the square multiplier 4 produces a parabolic wave with 1V-peak amplitude (a parabolic wave, see a waveform illustrated on the output side of the square mullipier 4). The DC bias 1 shifts the parabolic wave with 1V-peak amplitude so that the zero voltage of the parabolic wave with 1V-peak amplitude is $-3V$ and applies an output to the input Y of the multiplier 7. Since the input X of the multiplier 7 concurrently receives the triangular wave with 1V-peak amplitude, the multiplier 7 produces the output $V_o$ in a cubic waveform. This cubic waveform of the output $V_o$ of the multiplier 7 is very approximate to a sine-wave. An accurate adjustment of the V-shift of the DC bias 5 provides a 0.001% or lower distortion rate of the cubic waveform with reference to the sine-wave at a 3.0464808 V-shift.

A transfer function of the FIG. 1 triangular to sine wave converter is as follows:

$$V_o = -(V_i^3 - V\text{-shift} \times V_i) \qquad (8)$$

The equation (8) is converted to the following equation (9):

$$V_o = -V_i(V_i^2 - V\text{-shift}) \qquad (9)$$

is as follows.

Setting $V_i = X$, the V-shift at point of the minimum distortion rate is as follows:

$$2\int_0^{\pi/2} \sin X \, dX - \int_0^1 (X^3 - V\text{-shift}) dX \qquad (10)$$

In accordance with the equation (10), the V-shift at point of the minimum distortion rate is 3.0464808 V in order to as much approximate the output $V_o$ of the multiplier 7 to a sine wave as possible.

Figure 11:
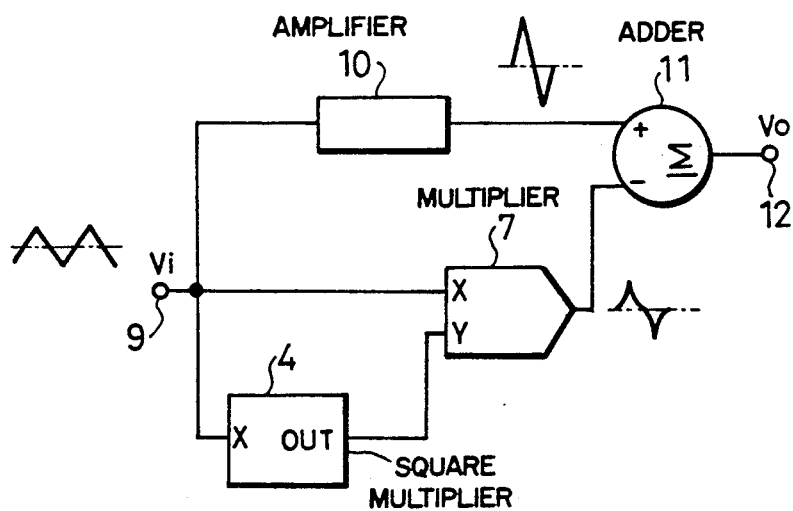
FIG. 11 is a circuit block diagram of a triangular to sine wave converter of an eighth embodiment of the present invention.

FIG. 11 is a circuit block diagram of a triangular to sine wave converter of an eighth embodiment of the present invention. A triangular-wave input $V_i$ applied to an input terminal 9 is applied to an input X of a square multiplier 4, a multiplier 7 and a triple amplifier 10. The square multiplier 4 receives the triangular-wave input $V_i$ to produce an output $V_i^2$ which in turn is applied to an input Y of the multiplier 7. The multiplier 7 receives the input voltages $V_i$ and $V_i^2$ to produce an output $V_i^3$ which is in turn applied to a minus input of an adder 11. The triple amplifier 10 substantially triples the triangular-wave input $V_i$ and applies an output to a plus input of the adder 11. The adder 11 computes a difference $(3V_i - V_i^3)$ between the input voltages and applies same to the output terminal 12.

The output $V_o$ appearing at the output terminal 12 is very approximate to a sine-wave. An accurate adjustment of the amplification factor of the triple amplifier 10 provides a 0.001% or lower distortion rate at a 3.046808 V output $V_o$.

Figure 12:
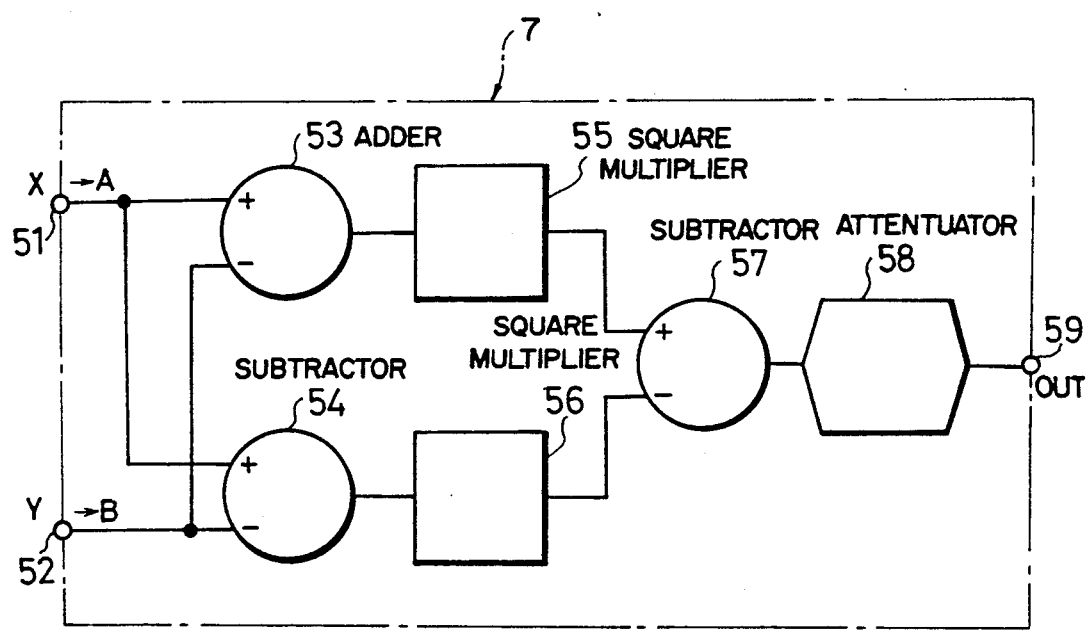
FIG. 12 is a block diagram of a circuit configuration of a multiplier.

As shown in FIG. 12, the multiplier 7 comprises an adder 53, subtracters 54 and 57, square multipliers 55 and 56 and an attenuator 58. The adder 53 adds an input at an input terminal 51 of the multiplier 7 constituing the input X thereof and an input at an input terminal 52 of the multiplier 7 constituting the input Y thereof to produce an output which is in turn applied to the square multiplier 55. The subtracter 54 substracts the input Y applied to the input terminal 52 of the multiplier 7 from the input X applied to the input terminal 51 of the multiplier 7 to produce a subtraction output which is in turn applied to the square multiplier 56. The square multiplier 55 squares an input to produce an output which is in turn applied to a plus input of the subtracter 57. The square multiplier 56 squares an input to produce an output which is in turn applied to a minus input of the subtracter 57. The subtracter 57 produces a subtraction output between the output squares of the square multipliers 55 and 56 which is applied to the attenuator 58. The attenuator 58 attenuates an input to be ¼ to apply the attenuation output to an output terminal 59. Sequentially executing these operations in the multiplier 7 produces a product AB from inputs A and B applied to the input terminals 51 and 52 of the multiplier 7.

Figure 13:
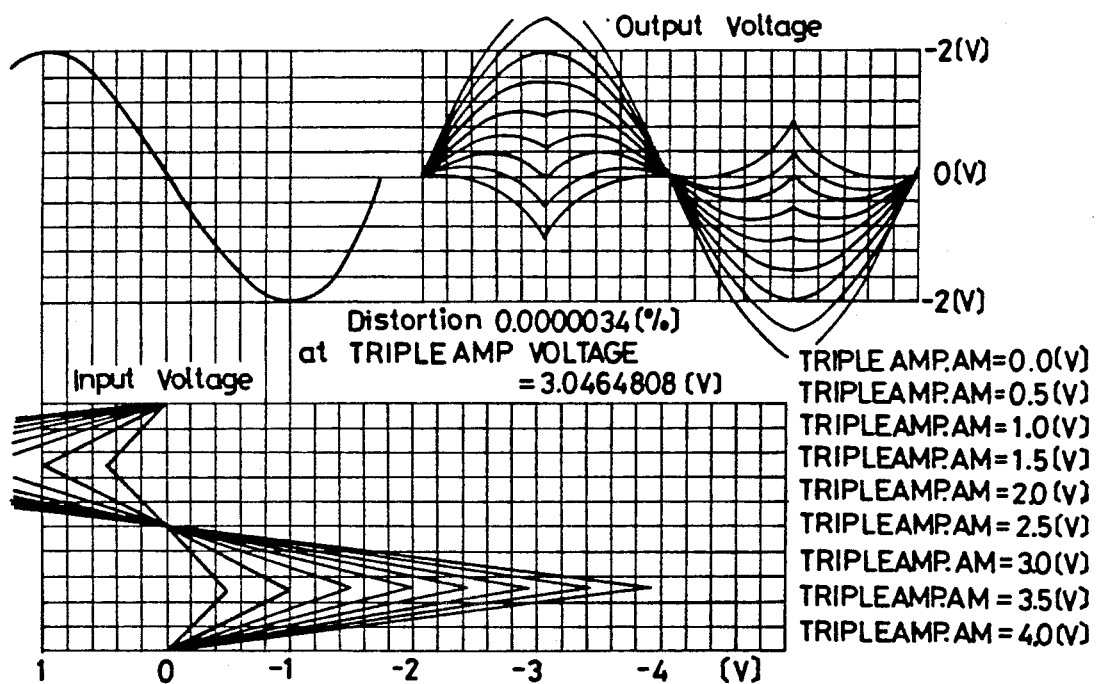
FIG. 13 is a graph illustrating a simulation characteristic of the operation of the triangular to sine wave converter of the eighth embodiment of the present invention.

FIG. 5 illustrates the operational characteristic of the triangular to sine wave converter of the seventh embodiment. FIG. 5 shows a change in output voltage when the shift voltage of the triangular to sine wave converter of the seventh embodiment ranges from 0.0–4.0 V. When the shift voltage is about 3.0 V, the triangular to sine wave converter of the seventh embodiment produces an ideal sinusoidal waveform. FIG. 13 illustrates the operational characteristic of the triangular to sine wave converter of the eighth embodiment. FIG. 13 shows a change in output voltage when an amplified voltage of the triangular to sine wave converter of the eighth embodiment ranges from 0.0–4.0 V. When the amplified voltage is about 3.0 V, the triangular to sine wave converter of the eighth embodiment produces an ideal sinusoidal waveform.

The triangular to sine wave converter of the seventh and eighth embodiments employ the square multiplier 4 as an element and the square multipliers 55 and 56 as a subelement of the triangular to sine wave converter of the seventh and eighth embodiments. As well known, a diode and an FET have a square characteristic, so that the triangular to sine wave converter of the present invention which may comprise a square multiplier made with the diode or FET produces an accurate high-frequency sine-wave at a low cost.

What is claimed is:

1. A sine wave generator, comprising:
   a first multiplier for receiving and squaring a triangular wave input;
   a direct current bias source operatively connected to said first multiplier for shifting an output of said first multiplier; and
   a second multiplier operatively connected to said direct current bias source for receiving and multiplying the triangular wave input by an output of said direct current bias source, to produce a cubic wave output approximate to a sine wave.

2. The sine wave generator of claim 1, further comprising:
   an adder operatively connected to said second multiplier for adding an output of said second multiplier to the triangular wave input.

3. The sine wave generator of claim 1, further comprising:
   a third multiplier operatively connected to said second multiplier for multiplying the triangular wave input by another predetermined voltage prior to input to said second multiplier.

4. A sine wave generator, comprising:
   first multiplier means for receiving and squaring a triangular wave input;
   second multiplier means operatively connected to said first multiplier means for receiving and multiplying an output of said first multiplier means by the triangular wave input;
   amplifier means for amplifying the triangular wave input by a predetermined amplification factor greater than one; and
   adding means, operatively connected to said amplifier means and said second multiplier means for adding an output of said second multiplier means to an output of said amplifier means to produce a cubic wave output, approximate to a sine wave.

5. The sine wave generator of claim 4, further comprising:
   third multiplying means, operatively connected to said second multiplying means for receiving and multiplying the triangular wave input by a predetermined voltage;
   said amplifier means including,
   fourth multiplying means for receiving and multiplying the triangular wave input by another predetermined voltage; and fifth multiplying means operatively connected to said fourth multiplying means for receiving and multiplying an output of said fourth multiplying means by still another predetermined voltage.

6. A sine wave generator, comprising:
a square multiplier for receiving and squaring a triangular wave input;
a direct current bias source operatively connected to said square multiplier for multiplying by a constant voltage of approximately three volts and inverting, an output of said square multiplier;
a multiplier operatively connected to said direct current bias source for receiving and multiplying the triangular wave input by an output of said direct current bias source to produce a cubic wave output approximately to a sine wave.

7. A sine wave generator, comprising:
square multiplier means for receiving and squaring a triangular-wave input;
multiplier means operatively connected to said square multiplier means for receiving and multiplying an output of said square multiplier means by the triangular wave input;
amplifier means for amplifying the triangular wave input by a predetermined amplification factor greater than one of approximately three volts; and
adding means operatively connected to said amplifier means and said multiplier means for adding an output of said multiplier means to an output of said amplifier means to produce a cubic wave output, approximate to a sine wave.

8. The sine wave generator of claim 6, wherein said multiplier comprises:
an adder for adding two inputs;
a first subtractor for subtracting the two inputs;
a second square multiplier operatively connected to said adder for squaring an output of the adder;
a third square multiplier operatively connected to said first subtractor for squaring an output of the first subtractor;
a second subtractor operatively connected to said second and third square multipliers for subtracting an output of said third square multiplier from an output of said second square multiplier; and
an attentuator operatively connected to said second subtractor for attenuating an output of the second subtractor by a factor of four.

9. The sine wave generator of claim 7, wherein said multiplier means includes,
an adder for adding two inputs of said multiplier means;
a first subtractor for subtracting the two inputs;
a first square multiplier operatively connected to said adder for squaring an output of the adder;
a second square multiplier operatively connected to said first subtractor for squaring an output of the first subtractor;
a second subtractor operatively connected to said first and second square multipliers for subtracting an output of said second square multiplier from an output of said first square multiplier; and
an attentuator operatively connected to said second subtractor for attenuating an output of the second subtractor by a factor of four.

10. A sine wave generator comprising:
squaring means for receiving and squaring a triangular wave input;

direct current biasing means, operatively connected to said squaring means, for biasing an output of said squaring means by a predetermined fixed voltage; and
multiplying means, operatively connected to said direct current biasing means for multiplying the triangular wave input by an output of said direct current biasing means to produce a cubic wave output, approximate to a sine wave.

11. The sine wave generator of claim 10, further comprising;
adding means, operatively connected to said multiplying means, for adding an output of said multipying means to the triangular wave input.

12. The sine wave generator of claim 10, further comprising; second multiplying means, operatively connected to said multiplying means, for multiplying the triangular wave input by another predetermined fixed voltage prior to input to said multiplying means.

13. A sine wave generator, comprising:
squaring means for receiving and squaring a triangular wave input;
first multiplying means, operatively connected to said squaring means, for multiplying an output of said squaring means by the triangular wave input;
amplifying means for amplifying the triangular wave input by a predetermined amplification factor greater than one; and
adding means, operatively connected to said first multiplying means and said amplifying means, for adding an output of said first multiplying means to an output of said amplifying means, to produce a cubic wave output, approximate to a sine wave.

14. The sine wave generator of claim 13, further comprising:
second multiplying means, operatively connected to said first multiplying means, for receiving and multiplying the triangular wave input by a predetermined voltage,
said amplifying means including,
third multiplying means for receiving and multiplying the triangular wave input by another predetermined voltage, and
fourth multiplying means, operatively connected to said third multiplying means, for multiplying an output of said third multiplying means by still another predetermined voltage.

15. The sine wave generator of claim 10, wherein said predetermined fixed voltage is a constant voltage of approximately three volts.

16. The sine wave generator of claim 13, wherein said predetermined amplification factor is a constant voltage of approximately three volts.

17. The sine wave genertor of claim 15, wherein said multiplying means includes,
adding means for adding two inputs,
first subtracting means for subtracting the two inputs,
first square multiplying means, operatively connected to said adding means, for squaring an output of said adding means,
second square multiplying means, operatively connected to said first subtracting means, for squaring an output of said first subtracting means,
second subtracting means, operatively connected to said first and second square multiplying means, for subtracting an output of said second square multiplying means from an output of said first square multiplying means, and attenuating means, operatively connected to said second subtracting means, for attentuating an output of said second subtracting means by a factor of four.

18. The sine wave generator of claim 16, wherein said first multiplying means includes,
adding means for adding two inputs,
first subtracting means for subtracting the two inputs,
first square multiplying means, operatively connected to said adding means, for squaring an output of said adding means,
second square multiplying means, operatively connected to said first subtracting means, for squaring an output of said first subtracting means,
second subtracting means, operatively connected to said first and second square multiplying means, for subtracting an output of said second square multiplying means from an output of said first square multiplying means, and
attenuating means, operatively connected to said second subtracting means, for attenuating an output of said second subtracting means by a factor of four.

19. A method for generating a sine wave comprising the steps of:
receiving and squaring a triangular wave input signal;
direct current biasing the squared triangular wave signal by a predetermined fixed voltage; and
multiplying the biased and squared triangular wave signal by the triangular wave input signal to produce a cubic wave output, approximate to a sine wave.

20. A method for generating a sine wave comprising the steps of:
receiving and squaring a triangular wave input signal;
multiplying the squared triangular wave input signal by the triangular wave input signal;
amplifying the triangular wave input signal by a predetermined amplification factor greater than one; and
adding the multiplied triangular wave input signal to the amplified triangular wave input signal, to produce a cubic wave output approximate, to a sine wave.

21. The method of claim 19, wherein said predetermined fixed voltage is a constant voltage of approximately three volts.

22. The method of claim 20, wherein said predetermined amplification factor is a constant voltage of approximately three volts.

* * * * *

UNITED STATES PATENT AND TRADEMARK OFFICE
CERTIFICATE OF CORRECTION

PATENT NO. : 5,132,636
DATED : July 21, 1992
INVENTOR(S) : T. Hori

It is certified that error appears in the above-identified patent and that said Letters Patent is hereby corrected as shown below:

On the title page, after item [22], insert the following:
 --[30] Foreign Application Priority Data
   Jan. 26, 1990 [JP]  Japan ............... Hei 2-17429--.

Signed and Sealed this

Eighth Day of December, 1992

Attest:

DOUGLAS B. COMER

*Attesting Officer*   *Acting Commissioner of Patents and Trademarks*